US006498095B2

(12) United States Patent
Matsuura

(10) Patent No.: US 6,498,095 B2
(45) Date of Patent: Dec. 24, 2002

(54) CVD METHOD FOR PRODUCING AN INTERCONNECTION FILM BY DEPOSITING A LOWER LAYER TO FILL A RECESS PERFORMING A CLEANING STEP TO REMOVE DISSOCIATED REACTANT GAS, AND CONSEQUENTLY DEPOSITING AN UPPER LAYER THAT HAS A SMALLER IMPURITY CONCENTRATION THAN THE LOWER LAYER

(75) Inventor: Kazunori Matsuura, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/943,045

(22) Filed: Aug. 30, 2001

(65) Prior Publication Data

US 2002/0045334 A1 Apr. 18, 2002

Related U.S. Application Data

(63) Continuation of application No. 09/270,336, filed on Mar. 16, 1999, now abandoned.

(30) Foreign Application Priority Data

Mar. 16, 1998 (JP) .......................................... 10-065781

(51) Int. Cl.[7] .......................................... H01L 21/443

(52) U.S. Cl. ...................... 438/652; 438/656; 438/680; 438/913

(58) Field of Search ................................ 438/618, 652, 438/656, 675, 680, 685, 913

(56) References Cited

U.S. PATENT DOCUMENTS 5,407,698 A * 4/1995 Emesh ........................ 427/99
5,731,225 A * 3/1998 Yamamori .................. 437/190
5,798,569 A 8/1998 Miyazaki et al.
5,821,620 A * 10/1998 Hong ......................... 257/751
5,956,609 A * 9/1999 Lee et al. ................... 438/627
6,030,893 A * 2/2000 Lo et al. ..................... 438/652
6,099,904 A 8/2000 Mak et al.
6,271,129 B1 * 8/2001 Ghanayem et al. ......... 438/675

FOREIGN PATENT DOCUMENTS

| | | |
|---|---|---|
| JP | 63-65075 | 3/1988 |
| JP | 6-104203 | 4/1994 |
| JP | 7-111253 | 4/1995 |
| JP | 8-241895 | 9/1996 |
| JP | 8-255770 | 10/1996 |
| TW | 293928 A | 12/1996 |

* cited by examiner

*Primary Examiner*—Olik Chaudhuri
*Assistant Examiner*—Stephen W. Smoot
(74) *Attorney, Agent, or Firm*—Scully, Scott, Murphy & Presser

(57) ABSTRACT

The interconnection system of the present invention comprises an interconnection film formed by chemical vapor deposition, wherein the interconnection film comprises an upper layer and a lower layer in which the concentrations of impurities are different. The method of producing an interconnection film comprising an upper layer and a lower layer by chemical vapor deposition using a single chamber, comprises: a lower layer forming step of depositing the lower layer in a recesses by evacuating the chamber and by injecting a reactant gas into the chamber; a cleaning step of subsequently reducing the partial pressure of impurities which are dissociated from the reactant gas; and an upper layer forming step of subsequently depositing an upper layer onto the lower layer by injecting a reactant gas into the chamber.

15 Claims, 3 Drawing Sheets

CVD METHOD FOR PRODUCING AN INTERCONNECTION FILM BY DEPOSITING A LOWER LAYER TO FILL A RECESS PERFORMING A CLEANING STEP TO REMOVE DISSOCIATED REACTANT GAS, AND CONSEQUENTLY DEPOSITING AN UPPER LAYER THAT HAS A SMALLER IMPURITY CONCENTRATION THAN THE LOWER LAYER

CROSS REFERENCE TO RELATED APPLICATION

The present application is a continuation application of parent application Ser. No. 09/270,336 filed on Mar. 16, 1999, now abandoned.

FIELD OF THE INVENTION

The present invention relates to an interconnection system formed by chemical vapor deposition (CVD) and a method for producing the same.

This application is based on Japanese Patent Application No. Hei 10-65781.

BACKGROUND ART

In the manufacturing of semiconductor circuits, an interconnection film is formed on a semiconductor substrate to connect active and passive elements.

The interconnection film is manufactured, in general, by a sputtering process in which particles are produced in a vacuum and are deposited onto the substrate, forming the thin film.

In recent years, as integration of circuits has progressed rapidly, aspect ratios of contact holes and through holes have increased, and the sputtering process is often unsatisfactory and ineffective to fill or plug the holes. There is a need to develop another process for manufacturing an interconnection film.

In addition to the sputtering process, chemical vapor deposition (CVD) has been found to be a convenient and effective process for forming interconnection films.

This process usually involves nucleating tungsten in holes (recesses) extending through an insulative layer, depositing a film to plug holes based on the tungsten nucleation, and depositing an upper layer onto the plugging film.

To performing the step of forming the upper layer onto the plugging film after plugging the holes in the insulative layer with tungsten film, a single-wafer type tungsten CVD device utilizes, in general, a single chamber.

The process for depositing the tungsten film using the single-wafer type tungsten CVD device involves introducing $WF_6$ as a reactant gas to deposit the film plugging the holes, and subsequently introducing $WF_6$ into the chamber to deposit the upper tungsten interconnection film onto the plugging film.

The present inventor has found, based on measurements of the warp of the semiconductor substrate using a stress measuring device, that stress occurs on the interconnections of the semiconductor substrate. The reflectance on the surface of the film measured by a reflectometer is low, and irregularities are detected on the surface of the film with the decreased reflectance by a SEM (scanning electron microscope).

After technically analyzing the above problem, the present inventor has reached the conclusion that when the semiconductor substrate warps due to the stress on the interconnections, the surface smoothness of the film which is to be a base for elements formed on the substrate is degraded, resulting in undesirable effects on the characteristics of the manufactured semiconductor device.

The reduction of the reflectance is caused by the irregularities on the surface of the upper interconnection film, which make the film thickness uneven, and in the following etching process residues or thinning may occur in the interconnection film, which may cause short-circuits.

The technical analysis by the present inventor shows that these problems are caused by fluorine which is dissociated from $WF_6$ and contaminates the interconnection film.

The Japanese Patent Application, First Publication No. Hei 7-111253 discloses a technique for depositing a tungsten film onto an insulative layer, which involves stopping supply of a reactant gas between the first and second steps while cleaning the surface of the film by flowing only a carrier gas.

This technique, however, merely cleans the surface of the film and does not control the concentration of the impurities, and it is therefore impossible to prevent the stress on the interconnection film and the reduction of the reflectance due to the impurities in the film. The problems in the background process for forming the interconnection film using the CVD remain.

SUMMARY OF THE INVENTION

It is therefore an object of the present invention to provide an interconnection system and a method for producing the same, which can avoid contamination of impurities dissolved from a reactant gas into an interconnection film, and which can improve the performance of a manufactured semiconductor device.

In order to accomplish the above object, the interconnection system of the present invention comprises an interconnection film formed by chemical vapor deposition, wherein the interconnection film comprises an upper layer and a lower layer in which the concentrations of impurities are different.

The concentration of the impurities in the upper layer is less than the concentration of impurities in the lower layer. Preferably, the concentration of the impurities in the upper layer is in a range of 1/7 to 1/5 of the concentration of the impurities in the lower layer. The impurities in the interconnection film are components dissociated from a reactant gas in a deposition process of the interconnection film. Increasing stress and reduced reflectance of said interconnection film are results of the impurities.

The interconnection film is formed by a two step process which involves depositing the lower layer and subsequently depositing the upper layer thereon. The lower layer fills a recess, and the upper layer is formed onto the lower layer.

The interconnection film is formed of tungsten using of $WF_6$ a reactant gas. The tungsten interconnection film contains the impurities of fluorine dissociated from the $WF_6$ gas. The concentration of the fluorine in the upper layer is in a range of 1/7 to 1/5 of the concentration of the fluorine in the lower layer.

In another aspect of the present invention, a method for producing an interconnection film comprising an upper layer and a lower layer by chemical vapor deposition using a single chamber, comprises: a lower layer forming step of depositing the lower layer in a recess by evacuating the chamber and by injecting a reactant gas into the chamber; a cleaning step of subsequently reducing a partial pressure of impurities which are dissociated from the reactant gas; and an upper layer forming step of subsequently depositing an upper layer onto the lower layer by injecting a reactant gas into the chamber.

The cleaning step comprises reducing the concentration of the impurities in the upper layer. The upper layer and the lower layer are made of the same materials. The concentration of the impurities in the upper layer is in a range of 1/7 to 1/5 of the concentration of the impurities in the lower layer.

In another aspect of the present invention, a method for producing an interconnection film comprising an upper layer and a lower layer by chemical vapor deposition using a single chamber, comprises: a lower layer forming step of depositing the lower layer in a recess, where tungsten is nucleated, by evacuating the chamber and by injecting a $WF_6$ reactant gas into the chamber; a cleaning step of subsequently reducing a partial pressure of fluorine which is dissociated from the $WF_6$ reactant gas and stays in the chamber; and an upper layer forming step of subsequently depositing an upper layer onto the lower layer by injecting a $WF_6$ reactant gas into the chamber.

The cleaning step comprises reducing the concentration of the fluorine in the upper layer. The concentration of the fluorine in the upper layer is in a range of 1/7 to 1/5 of the concentration of the fluorine in the lower layer. The ratio of the flows of the reactant gases in the lower layer forming step and in the upper layer forming step is in a range of approximately 1:0.25 to 1:0.5.

The cleaning step may include injecting only a replacement gas into the chamber. In the cleaning step, the replacement gas is an inert gas or a reducing gas, and the degree of vacuum in the chamber is in a range of $10^2$ to $10^{-2}$ Torr. The cleaning step may include evacuating the chamber. In the cleaning step, the degree of vacuum is in a range of $10^{-1}$ to $10^{-3}$ Torr. The cleaning step may include both evacuating the chamber and injecting a replacement gas into the chamber. In the cleaning step, the degree of vacuum in the chamber is in a range of $10^{-2}$ to $10^{-1}$ Torr.

According to the present invention, stress on the interconnection film and reduction of the reflectance can be prevented because the interconnection film is formed while the concentration of the impurities in the upper layer is reduced.

Further, the cleaning process is performed between the lower layer forming step and the upper layer forming step, and the steps are performed consecutively, enhancing process efficiency.

DETAILED DESCRIPTION OF THE PREFERRED EMBODIMENTS

The best mode embodiments of the present invention will be explained with reference to figures.

First Embodiment

Figure 1:
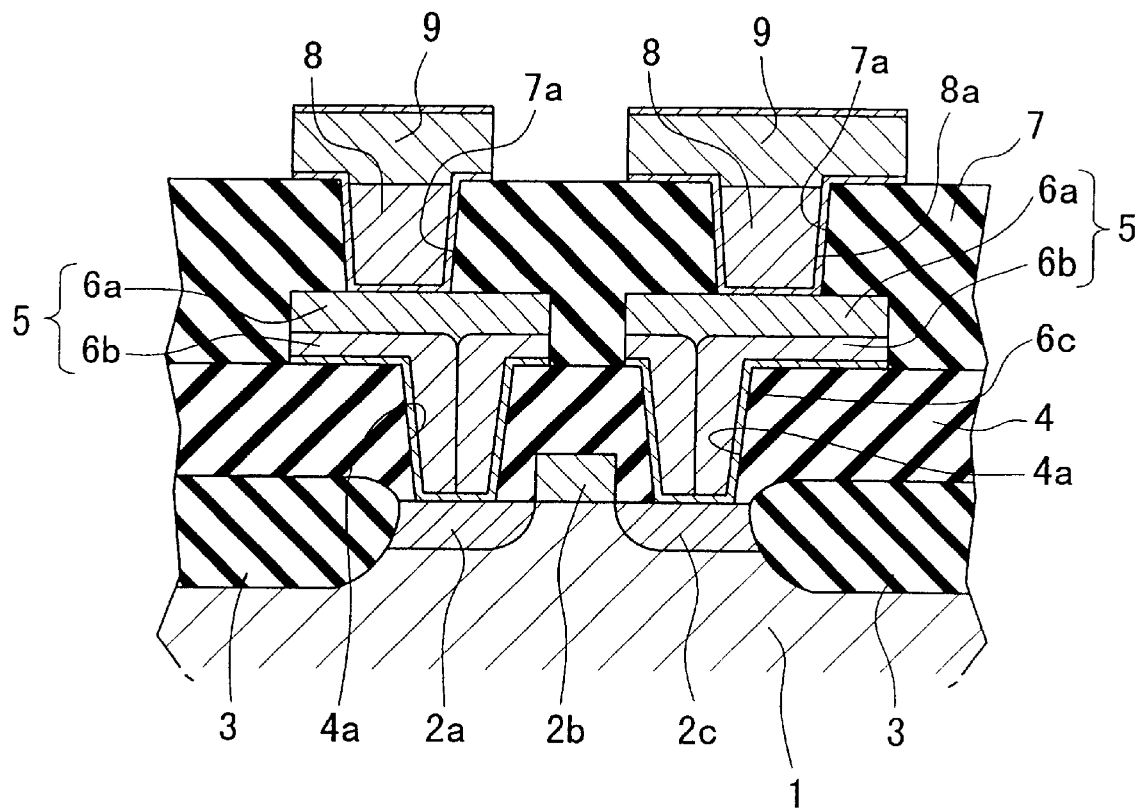
FIG. 1 is a cross sectional view showing an interconnection system in a semiconductor device of the present invention.
Figure 3:
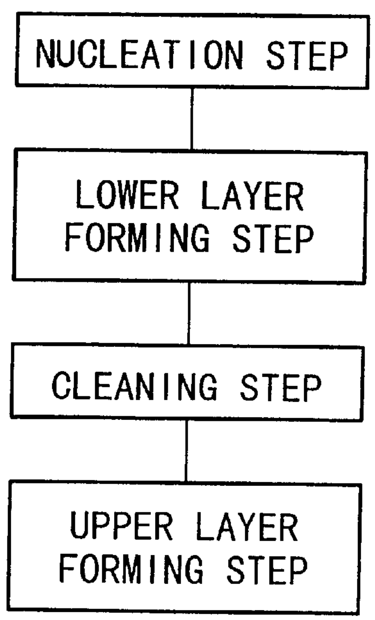
FIG. 3 is a flow chart showing a method for producing the interconnection system of the present invention.
Figure 2:
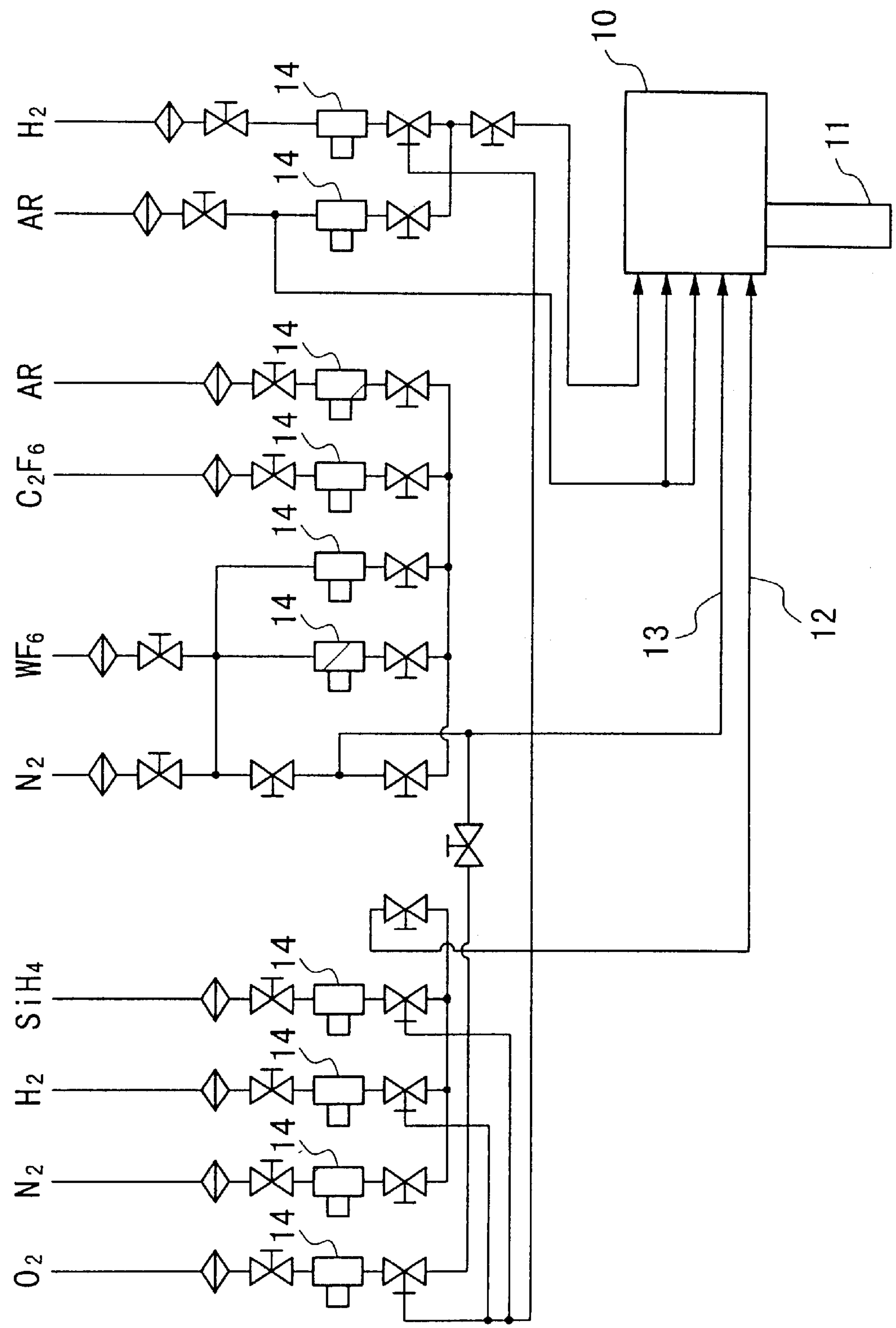
FIG. 2 is a schematic diagram showing a device for forming a tungsten film of the present invention.

FIG. 1 is a cross-sectional view showing an interconnection system of a first embodiment of the present invention, FIG. 2 is a chemical vapor deposition device for forming the interconnections of the first embodiment, and FIG. 3 is a flow chart showing a method for forming the interconnections of the first embodiment.

Referring to the figures, the interconnection system comprises an interconnection film 5 manufactured by chemical vapor deposition, and the film 5 includes an upper layer 6*a* and a lower layer 6*b* whose concentrations of impurities are different.

The concentration of the impurities in the upper layer 6*a* of the interconnection film 5 is lower than, and preferably in a range of 1/7 to 1/5 of that of, the lower layer 6*b*.

The impurities in the interconnection film 5, which are dissociated from the reactant gas when forming the film, may increase the stress on the interconnection film 5 and may reduce the reflectance thereof.

The upper layer 6*a* and the lower layer 6*b* in the interconnection film 5 are formed by a two step process in which the lower layer 6*b* is deposited, plugging holes (recess) 4*a*, and in which the upper layer 6*a*is then deposited onto the lower layer 6*b* .

The interconnection system of the present invention will be explained in an example of the tungsten interconnection film 5.

In FIG. 1 showing a construction of a semiconductor device with the interconnection system, a transistor with a source 2*a*, a gate electrode 2*b*, and a drain 2*c*is located in an element formation area defined by a LOCOS (Local Oxidation of Silicon) 3, and the holes (recesses) 4*a*, which are called contact holes, extend through an insulative layer 4 coating the surface of the semiconductor substrate.

The tungsten lower layer (buried film) 6*b* plugs the holes 4*a* in the insulative layer 4, and partly lies on the upper surface of the insulative layer 4. The tungsten upper layer 6*a* is integrally layered on the lower layer 6*b*.

The upper and lower layers 6*a* and 6*b* are patterned on desired shapes by an etching process. The patterned layers 6*a* and 6*b* are coated with an upper insulative layer 7, on which interconnection film 9 is then formed. By tungsten plugs 8 filling holes 7*a* through the insulative layer 7, the layers 9 and 6*b* above and below the insulative layer 7 are electrically connected. Before the deposition of tungsten, TiN/Ti films 6*c* and 8*a* are formed on inside walls of the holes 4*a* and 7*a* in the insulative layers 4 and 7.

In general, the second or subsequent layer, which is, for example, the interconnection film 9 in FIG. 1, is made of a material whose resistivity is lower than that of tungsten, such as aluminum (AL), aluminum/copper (AL/Cu), and aluminum/titanium (AL/TiN).

In the background art, when forming the tungsten interconnection film 5 by the CVD process, both deposition of the lower tungsten layer 6*b* in the holes 4*a* through the insulative layer 4 and deposition of the upper layer 6*a* are performed consecutively in a single vacuum chamber, resulting in entry of fluorine into the interconnection film 5, and in particular, into the upper layer 6*a*.

It has been found, from measurements of the warp of a semiconductor substrate measured by a stress measuring device, that stress occurs on interconnections of a semiconductor substrate whose interconnection films contain fluorine dissociated from $WF_6$. Reflectance measured by a reflectometer decreases, and irregularities are detected on the surface of the film with the decreased reflectance by a SEM (scanning electron microscope).

After technically analyzing the above problem, the present inventor reached the following conclusions:

1) when the semiconductor substrate warps due to the stress on the interconnections, the surface smoothness of the film, which is to be a base for elements formed on the substrate, is degraded, resulting in undesirable effects on the characteristics of the manufactured semiconductor device, and
2) the reduction of the reflectance is caused by irregularities on the surface of the upper interconnection film, which makes the film thickness uneven, and in the following etching process residues or thinning may occur in the interconnection film, which may cause short-circuits.

The object of the first embodiment is to prevent entry of fluorine, which is dissociated from the main reactant gas $WF_6$, into the upper layer 6*a*.

The manufacturing device for producing the tungsten interconnection system of the first embodiment according to the present invention will be explained with reference to FIG. 2.

Referring to FIG. 2, the manufacturing device comprises a chamber 10, a vacuum device 11, a gas supply device 12, and a partial pressure reduction device 13.

The chamber 10 is a vessel which can be brought to a vacuum by the vacuum device 11, while the gas supply device 12 injects the reactant gas into the vacuum chamber 10. The flow of the reactant gas is controlled by a flow meter 14 so that the ratio of the flow of the reactant gas forming the lower layer 6*b* to the flow of the reactant gas forming the upper layer 6*a* is set in a range of approximately 1:0.25 to 1:0.5. $WF_6$ is mainly used as the reactant gas, and the gases $H_2$ and $SiH_4$ are introduced to reduce the $WF_6$. To purge the chamber 10 after completion of all the film forming steps, tubes for injecting other inert gases (for example, AR, and $N_2$) are connected to the chamber 10. By flowing $C_2F_6$ and $O_2$ into the chamber 10, a tungsten film accumulating in the chamber 10 can be removed.

The partial pressure reduction device 13 reduces the partial pressure of impurities which stay in the chamber 10, decreasing the concentration of the impurities in the upper layer 6*a*. The partial pressure reduction device 13 includes the tubes for injecting the inert gases (for example, AR, and $N_2$), whose flows are controlled by the flow meters 14. The tubes are connected to the chamber 10 to purge the chamber 10 during the film forming steps and after completion of all film forming steps.

With the device shown in FIG. 2, the steps for forming the tungsten interconnection film 5 of the first embodiment by the chemical vapor deposition will be explained.

Figure 4A:
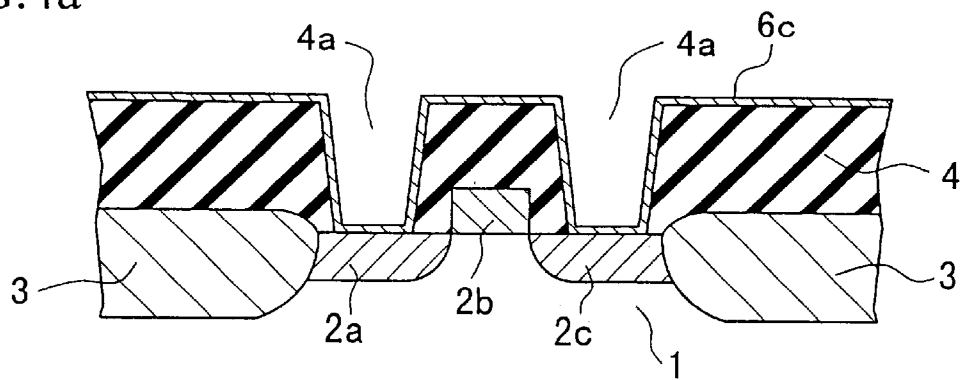
FIGS. 4*a* to 4*d* are cross sectional views showing steps in the method for producing the interconnection system of the present invention.

FIG. 4*a* shows the initial state before the deposition of the tungsten film, in which the transistor with the source 2*a*, the gate electrode 2*b*, and the drain 2*c* are provided on the element formation area defined by the LOCOS 3 on the semiconductor substrate 1, and the holes 4*a* are made through the insulating film 4 layered on the whole surface of the semiconductor substrate. The holes 4*a* extend toward the source 2*a* and the drain 2*c*. The inside walls of the holes 4*a* in the insulative layer 4 are coated with the TiN/Ti film 6*c* before the deposition of the tungsten.

Figure 4B:
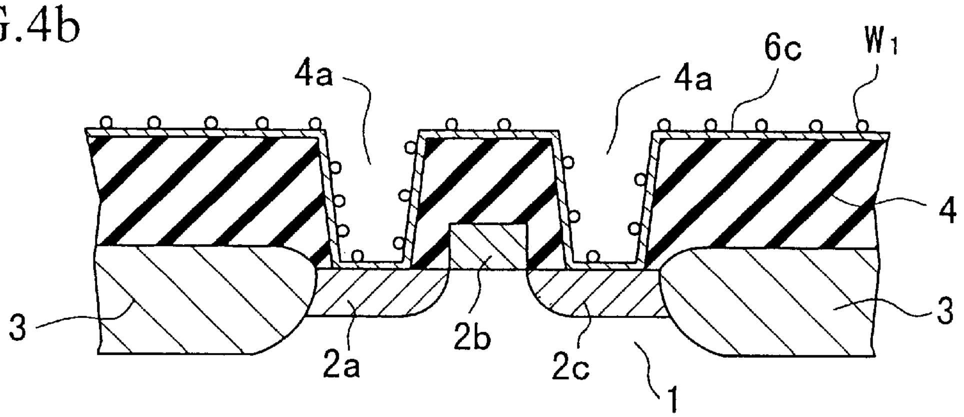
Figure 4C:
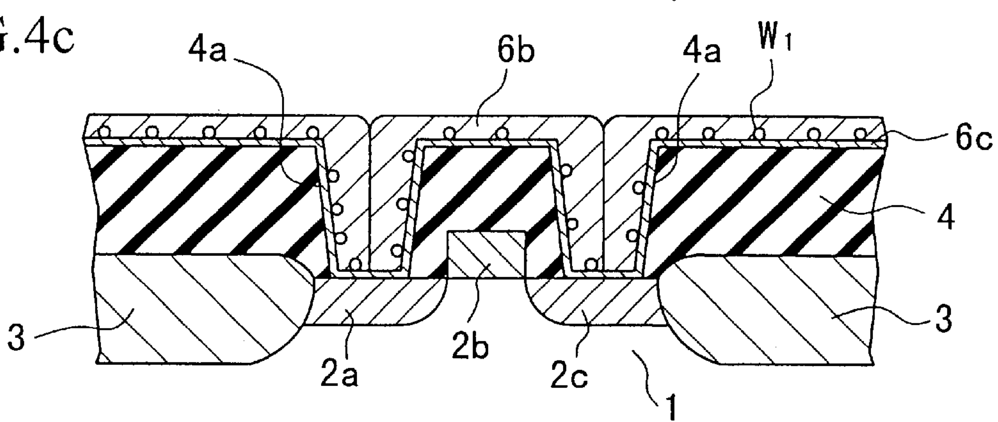
Figure 4D:
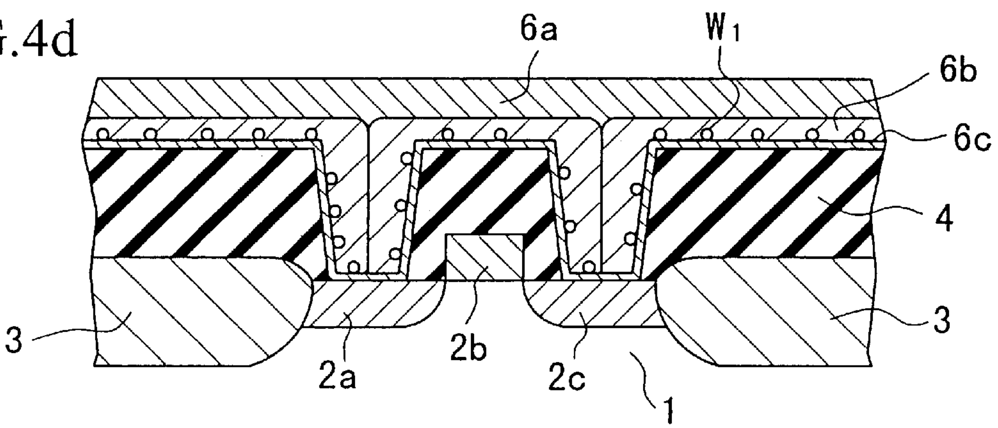

FIGS. 4*b* to 4*d* show the steps of depositing the tungsten film of the first embodiment. The chamber shown in FIG. 2 is held to a vacuum by the vacuum device 11, while the reactant gas $WF_6$ is injected into the chamber 10 by the gas supply device 12, so that the semiconductor substrate contacts the reactant gas, thus nucleating tungsten $W_1$ on the inside walls of the holes 4*a* and on the surface of the TiN/Ti film 6*c* (in a nucleation step shown in FIG. 3).

As shown in FIG. 4*c*, by performing nucleation of the tungsten $W_1$, the tungsten layer (buried film) 6*b* fills the holes 4*a* (in a lower layer forming step in FIG. 3).

After the lower layer forming step as shown in FIG. 4*c*, fluorine which is dissociated from the $WF_6$ stays in the chamber 10. Therefore, if the tungsten upper layer 6*a* is layered on the lower layer 6*b* just after the lower layer forming step, the fluorine may enter into the layer 6*a*.

To avoid this, a cleaning process in FIG. 3 is performed after the lower layer forming step of FIG. 4*c* prior to the upper layer forming step of FIG. 4*d*. In the cleaning process, the chamber 10 is held to a vacuum by the vacuum device 11, and a replacement gas is introduced into the chamber 10 by the partial pressure reduction device 13. The fluorine, which was dissociated from the $WF_6$ and stays in the chamber 10, is replaced by the replacement gas, thus reducing the partial pressure of the fluorine component in the chamber 10 while evacuating the chamber 10. Thus, the chamber 10 undergoes a cleaning process, so that the concentration of the fluorine arising from the $WF_6$ is reduced. In the cleaning process, the achieved degree of vacuum is set in a range of $10^2$ to $10^{-2}$ (1.0E2 to 1.0E-2) (Torr).

The replacement gas is, for example, an inert gas such as $N_2$, Ar, and He, or a reducing gas such as $H_2$, and is preferably injected into the chamber 10 at the flow of several hundreds to several thousands SCCM.

Referring to FIG. 4*d*, a reactant gas ($WF_6$) is again injected into the chamber 10 in which the partial pressure of the impurities has been reduced in the cleaning process, so that the upper layer 6*a* is deposited onto the lower layer 6*b* (in an upper layer forming step in FIG. 3). The lower and upper layers 6*a* and 6*b* are integrally layered because of their common material which is tungsten in the first embodiment.

Preferably, the ratio of the flows of the reactant gases in the lower layer forming step and in the upper layer forming step is in a range of approximately 1:0.25 to 1:0.5.

Then, the upper and lower layers 6*a* and 6*b* are patterned on a desired shape in an etching process (see FIG. 1).

According to the first embodiment, because the partial pressure of the impurities is reduced by the replacement gas and the chamber 10 is brought to a vacuum and is evacuated, the fluorine in the chamber 10 is effectively removed.

In the cleaning step using both the evacuation of the chamber 10 to a vacuum and the replacement with the replacement gas, the fluorine which is dissociated from $WF_6$ and stays in the chamber 10 may be replaced with the replacement gas, and subsequently the chamber 10 may be brought to a vacuum, thus reducing the partial pressure of the fluorine in the chamber 10. Alternatively, the chamber 10 may be brought to a vacuum, and subsequently the fluorine in the chamber 10 may be replaced with the replacement gas, thus reducing the partial pressure of the fluorine in the chamber 10. Alternatively, the chamber 10 may be brought to a vacuum along with a continuous supply of the replacement gas into the chamber 10, thus reducing the partial pressure of the fluorine in the chamber 10.

The chamber 10 is brought to a vacuum, the fluorine which is dissociated from the $WF_6$ and stays in the chamber 10 is replaced with the replacement gas, reducing the partial pressure of the fluorine, and subsequently the upper layer 6*a* is formed in the clean chamber, thereby preventing the entry of the fluorine into the layer 6*a*. As a result, the concentration of the impurities (the fluorine dissociated from the $WF_6$) in the upper layer 6*a* becomes less than that of the lower layer 6*b*, and for example, the concentration of the impurities in the upper layer 6*a* is 1/7 to 1/5 of that in the lower layer 6*b*.

The following table shows a comparison of the stress and the reflectance of the first embodiment and the background art. The stress is measured when the lower layer 6*b* is 3500 Å, the upper layer 6*a* is 2000 Å, and the interconnection layer 5 is 5500 Å in thickness. The reflectance is measured using light at a wavelength of 480 nm and is expressed in ratios to the reflectance of mirror finished single crystal silicon, which is assigned 100%.

| | BACKGROUND ART | FIRST EMBODIMENT |
|---|---|---|
| Stress (Dyne/SQ) | $8.0 \times 10^9$ | $7.0 \times 10^9$ |
| Reflectance (VS Si %) | 73 | 85 |

As is apparent from the table, entry of the fluorine into the interconnection film, occurrence of stress on the interconnection film, and reduction of the reflectance of the interconnection film can be avoided because the partial pressure of the fluorine, which is dissociated from $WF_6$ and stays in the chamber 10, is reduced and the reactant gas is introduced into the chamber 10 to form the interconnection film.

In the cleaning step of the present invention, by bringing the chamber 10 to a predetermined degree of vacuum, the efficiency of the reduction of the partial pressure of the impurities can be enhanced.

Second Embodiment

While in the cleaning step in the above first embodiment both the evacuation of the chamber 10 to a vacuum and the replacement using the replacement gas are performed to reduce the partial pressure of the impurities, the present invention is not limited to this embodiment.

In the cleaning step, only the replacement gas may be injected into the chamber 10 to reduce the partial pressure of the impurities in the chamber 10. Preferably, the degree of vacuum is in a range of $10^2$ to $10^{-2}$ (1.0E2to 1.0E-2) Torr. The cleaning step provides the advantage of a reduction of the adhesion of particles, because a change of pressure is prevented.

Alternatively, in the cleaning step, the chamber 10 may be brought to a vacuum to eliminate the impurities from the chamber 10, reducing the partial pressure of the impurities in the chamber 10. Preferably, the degree of vacuum is in a range of $10^{-1}$ to $10^{-3}$ (1.0E-1 to 1.0E-3) Torr. The cleaning step enhances the efficiency in reduction of the partial pressure of the impurities dissociated from the reactant gas and shortens the process time.

While in the embodiment the interconnection film is made of tungsten, the material is not limited to this embodiment and other conductive materials may be used in the interconnection film. Although, when the interconnection film is formed of another conductive material, the impurities may be dissociated from the reactant gas, stay in the chamber, and may contaminate the upper layer, the present invention can reduce stress on the interconnection film and can prevent a reduction of the reflectance.

According to the present invention, stress on the interconnection film and reduction of the reflectance can be prevented because the interconnection film is formed while the concentration of the impurities in the upper layer is reduced.

Further, the cleaning process is performed between the lower layer forming step and the upper layer forming step, and the steps are performed consecutively, enhancing process efficiency.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A method for producing an interconnection film comprising an upper layer and a lower layer filling a recess by chemical vapor deposition using a single chamber, comprising:

a nucleating step comprising evacuating said chamber, injecting a reactant gas into said chamber and nucleating said reactant gas in said recess;

a lower layer forming step of depositing said lower layer comprised of said nucleated reactant gas in said recess, said lower layer filling said recess;

a cleaning step of subsequently reducing a partial pressure of impurities which are dissociated from said reactant gas; and an upper layer forming step of subsequently depositing said upper layer onto said lower layer by injecting a reactant gas into said chamber.

2. A method according to claim 1, wherein said cleaning step comprises reducing the concentration of said impurities in said upper layer.

3. A method according to claim 1, wherein said upper layer and said lower layer are made of the same materials.

4. A method according to claim 1, wherein the concentration of said impurities in said upper layer is in a range of $\frac{1}{7}$ to $\frac{1}{5}$ of the concentration of said impurities in said lower layer.

5. A method according to claim 1, wherein, in said cleaning step, a replacement gas is injected into said chamber.

6. A method according to claim 5, wherein, in said cleaning step, said replacement gas is an inert gas or a reducing gas.

7. A method according to claim 5, wherein, in said cleaning step, the degree of vacuum in said chamber is in a range of $10^2$ to $10^{-2}$ Torr.

8. A method according to claim 5, wherein said cleaning step comprises evacuating said chamber.

9. A method according to claim 8, wherein, in said cleaning step, the degree of vacuum is in a range of $10^{-1}$ to $10^{-3}$ Torr.

10. A method according to claim 5, wherein said cleaning step comprises evacuating said chamber and injecting a replacement gas into said chamber.

11. A method according to claim 10, wherein, in said cleaning step, the degree of vacuum in said chamber is in a range of $10^2$ to $10^{-2}$ Torr.

12. A method for producing an interconnection film comprising an upper layer and a lower layer filling a recess by chemical vapor deposition using a single chamber, comprising:

a nucleating step, where tungsten is nucleated, comprising evacuating said chamber and injecting a reactant gas of $WF_6$ into said chamber and nucleating said $WF_6$ to form tungsten in said recess;

a lower layer forming step of depositing said tungsten in said recess based on the nucleation, said lower layer filling the recess;

a cleaning step of subsequently reducing the partial pressure of fluorine which is dissociated from said $WF_6$ reactant gas; and an upper layer forming step of subsequently depositing said upper layer onto said lower layer by injecting a reactant gas of $WF_6$ into said chamber.

13. A method according to claim 12, wherein said cleaning step comprises reducing the concentration of said fluorine in said upper layer.

14. A method according to claim 12, wherein the concentration of said fluorine in said upper layer is in a range of 1/7 to 1/5 of the concentration of said fluorine in said lower layer.

15. A method according to claim 12, wherein a ratio of the flows of said reactant gases in said lower layer forming step and in said upper layer forming step is in a range of approximately 1:0.25 to 1:0.5.

* * * * *